US009742056B2

(12) United States Patent
Lagnado et al.

(10) Patent No.: US 9,742,056 B2
(45) Date of Patent: Aug. 22, 2017

(54) INTEGRATED ANTENNA AND PROXIMITY SENSOR ELEMENT

(71) Applicant: Hewlett-Packard Development Company, L.P., Houston, TX (US)

(72) Inventors: Isaac Lagnado, Houston, TX (US); Timothy Neill, Houston, TX (US); Shih Huang Wu, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 23 days.

(21) Appl. No.: 14/765,325

(22) PCT Filed: Jan. 31, 2013

(86) PCT No.: PCT/US2013/024208
§ 371 (c)(1),
(2) Date: Jul. 31, 2015

(87) PCT Pub. No.: WO2014/120223
PCT Pub. Date: Aug. 7, 2014

(65) Prior Publication Data
US 2015/0372371 A1  Dec. 24, 2015

(51) Int. Cl.
*H01Q 1/24* (2006.01)
*H01Q 1/22* (2006.01)
*H01Q 9/42* (2006.01)
*H03K 17/955* (2006.01)
*G01R 27/26* (2006.01)
*H03K 17/96* (2006.01)

(52) U.S. Cl.
CPC .......... *H01Q 1/22* (2013.01); *G01R 27/2605* (2013.01); *H01Q 1/243* (2013.01); *H01Q 1/245* (2013.01); *H01Q 9/42* (2013.01); *H03K 17/955* (2013.01); *H03K 2017/9602* (2013.01); *H03K 2217/960755* (2013.01); *Y10T 29/4902* (2015.01)

(58) Field of Classification Search
CPC ....................................................... H01Q 1/243
USPC ......................................................... 343/702
See application file for complete search history.

(56) References Cited

U.S. PATENT DOCUMENTS

2011/0012793 A1   1/2011  Amm et al.
2011/0250928 A1  10/2011  Schlub et al.
2012/0214412 A1*  8/2012  Schlub ................... G01B 7/023
                                                            455/41.1

(Continued)

FOREIGN PATENT DOCUMENTS

CN  101958455   1/2011
CN  102646861   8/2012
CN  102714346  10/2012

(Continued)

OTHER PUBLICATIONS

International Search Report and Written Opinion, International Application No. PCT/US2013/024208, Date of Mailing: Oct. 28, 2013, pp. 1-12.

*Primary Examiner* — Graham Smith
(74) *Attorney, Agent, or Firm* — International IP Law Group PLLC

(57) ABSTRACT

An example electronic device may include an antenna module comprising an active element and a ground plane. The electronic device may include a proximity sensor element integrated within the antenna module, wherein the proximity sensor element is to detect proximity of a user.

11 Claims, 6 Drawing Sheets

(56) References Cited

U.S. PATENT DOCUMENTS

2012/0258772 A1 10/2012 Brogle et al.
2012/0319918 A1 12/2012 Ramachandran et al.

FOREIGN PATENT DOCUMENTS

EP 2551955 A2 1/2013
KR 10-2012-0044999 A 5/2012

* cited by examiner

104

600

INTEGRATED ANTENNA AND PROXIMITY SENSOR ELEMENT

BACKGROUND

Computing devices generally include an antenna module to connect wirelessly to a base station. The antenna module may be included in a computing device such as a laptop, tablet, smartphone, cell phone, and the like. Specific absorption rate (SAR) is a way of measuring the quantity of radio frequency (RF) energy that is absorbed by the body. A computing device has to comply with a regulatory limit on SAR.

BRIEF DESCRIPTION OF THE DRAWINGS

Certain examples are described in the following detailed description and in reference to the drawings, in which.

DETAILED DESCRIPTION OF SPECIFIC EMBODIMENTS

In order to comply with regulatory requirements, some antenna modules may be associated with a proximity sensor element near the antenna module. The proximity sensor element utilizes capacitive low frequency charge and discharge to detect changes in capacitance that may be associated with the proximity of the user. Providing the proximity sensor element near the antenna module requires additional volume reserved for the proximity sensor element pad. The present techniques relate to an antenna module having an integrated proximity sensor element. The antenna module includes the proximity sensor element within the structure. The proximity sensor element detects changes in capacitance that may be associated with the proximity of a user. The proximity sensor element may be integrated with circuitry of the antenna module to enable the antenna module to reduce transmission of signals, such as radio signals, to a tower, base station, wireless router, and the like.

Figure 1:
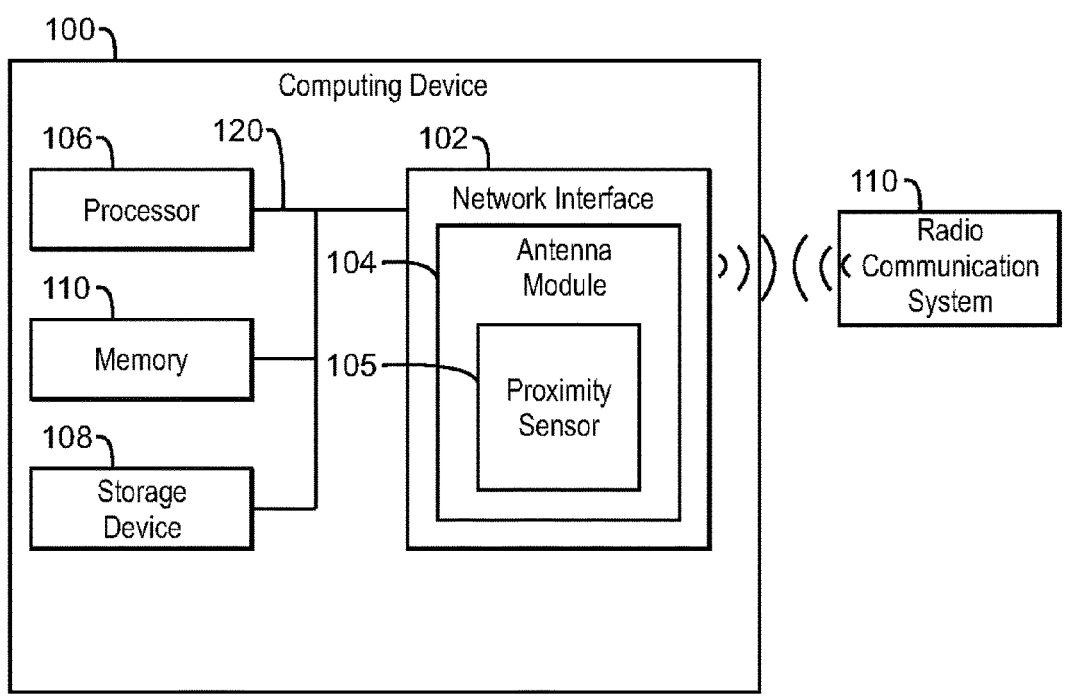
FIG. 1 is a block diagram illustrating a computing device including an antenna module with an integrated proximity sensor element according to an implementation.

FIG. 1 is a block diagram illustrating a computing device 100 including an antenna module 104 with an integrated proximity sensor element 105. The computing device 100 also includes a processor 106 and a storage device 108. The antenna module 104 may be a structure of a low profile antenna such as a patch antenna. The antenna module 104 may be constructed on a dielectric substrate, and communicatively coupled to the computing device 100.

The computing device 100 may be, for example, a laptop computer, desktop computer, tablet computer, mobile device, server, or cellular phone, a wearable computing device, among others. The processor 106 can be a single core processor, a multi-core processor, a computing cluster, or any number of other configurations. The processor 106 may be implemented as Complex Instruction Set Computer (CISC) or Reduced Instruction Set Computer (RISC) processors, x86 Instruction set compatible processors, multi-core, or any other microprocessor or central processing unit (CPU). In some embodiments, the main processor 106 includes dual-core processor(s), dual-core mobile processor(s), or the like.

The computing device 100 may include a memory device 110. The memory device 110 can include random access memory (e.g., SRAM, DRAM, zero capacitor RAM, SONOS, eDRAM, EDO RAM, DDR RAM, RRAM, PRAM, etc.), read only memory (e.g., Mask ROM, PROM, EPROM, EEPROM, etc.), flash memory, or any other suitable memory systems.

The processor 106 may be connected through a system bus 120 (e.g., PCI, ISA, PCI-Express, HyperTransport®, NuBus, etc.) to the sensor interface 104. The processor 106 may also be linked through the system bus 120 to the network interface 102 adapted to connect the computing device 100 to a radio communication system 110. The radio communication system 110 may be a structure disposed remote from the computing device 100 and may communicate with the computing device 100 via wireless signals. In some embodiments, the radio communication system 110 may be a wireless router, a peripheral computing device adapted to provide a wireless signal, a cell phone station, and the like.

The storage device 108 may be a non-transitory computer-readable medium. The storage device 108 may have instructions stored thereon that when executed by the processor 106 cause the computing device 100 to perform operations. In some embodiments, the operations may be executed by a controller (not shown). In these embodiments, the controller may be a microcontroller configured to carry out the operations related to receiving voltage related to contextual data. In other embodiments, the operations may be executed by logic at least partially comprising hardware logic. Hardware logic at least partially includes hardware, and may also include software, or firmware. Hardware logic may include electronic hardware including interconnected electronic components to perform analog or logic operations on the computing device 100. Electronic hardware may include individual chips/circuits and distributed information processing systems. The operations may include reducing the communication of the antenna module 104 when a user is detected to be nearby. For example, the antenna module 104 may be electrically coupled to a transmitter configured to communicate radio frequencies with the radio communication system 110. If a user is nearby, the proximity sensor element 105 may reflect a change in capacitance. In response, the computing device 100 may reduce the signal strength of the transmitter.

Figure 2:
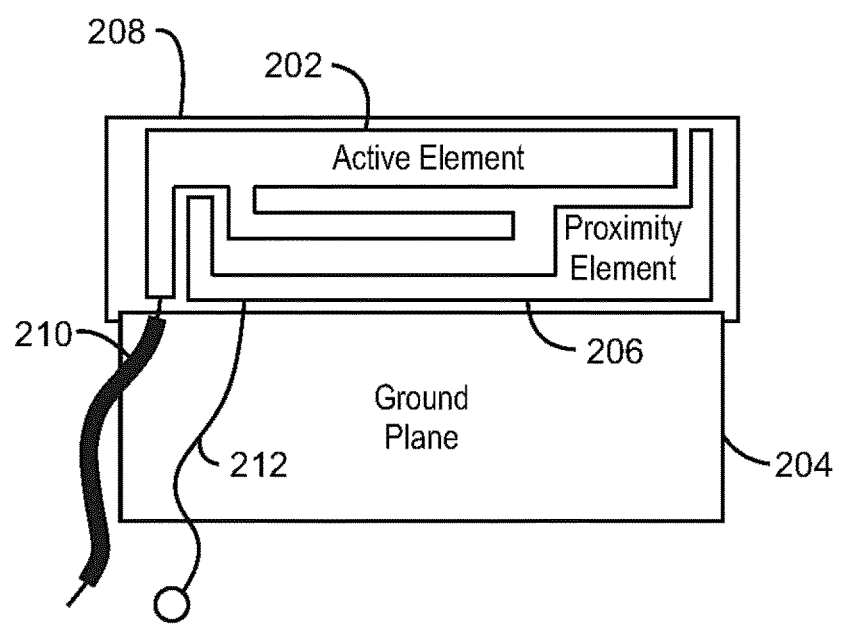
FIG. 2 is a top view of the antenna module with a parasitic proximity sensor element according to an implementation.

FIG. 2 is a top view of the antenna module 104 with a parasitic proximity sensor element 206. The antenna module 104 includes an active element 202, a ground plane 204, and a proximity sensor element 206. In this and other embodiments, the active element 202 may be a sheet of metal mounted over the ground plane 204. The active element 202 is electrically coupled to a receiver (not shown) and a transmitter (not shown). The active element 202 may be configured to receive radio frequency signals by collecting incoming radio frequency signals to be provided to the receiver. The active element 202 may be configured to transmit and receive wireless communication. The active element 202 may be configured to transmit radio frequency signals by being driven by the transmitter. The ground plane 204 is an electrically conductive surface that may be electrically coupled to electrical ground. The ground plane 204 may be a conductive sheet of metal relatively larger than the active element 202. The active element 202, the proximity sensor element 206, and the ground plane 204 may be any type of conductive elements including stamped metal components, etched components of a printed circuit board, a metal deposits on a piece of plastic, and the like.

The active element 202 is configured to communicate wireless signals with a radio tower, wireless modem, and the like. The active element 202 is disposed above the ground plane 204, and the proximity element 206 is separate from the active element 202. In some embodiments, each of the active element 202 and the proximity element 206 may be capacitively coupled to the ground plane 204. The active element 202 is coupled to a conductive interconnect 210, such as a coaxial cable. The conductive interconnect 210 may be configured to communicate radio frequency signals between the antenna module 104 and the computing device 100. The proximity sensor element 206 may be coupled to a sensor pad interconnect 212. The sensor pad interconnect 212 may be configured to communicate between an integrated circuit (not shown) of the computing device 100 to reduce communication of the active element 202 when a user is detected to be nearby. The transmission of wireless communication via the active element 202 may be reduced. The ground plane 204 may be coupled to a shield (not shown) of the conductive interconnect 210. The term "proximity sensor element," as referred to herein, includes a proximity sensor for example a capacitive photoelectric sensor, an inductive proximity sensor, a capacitive displacement sensor, or another proximity sensor.

In these and other embodiments, the antenna module 104 may include an antenna window 208. The antenna window 208 may be a physical opening in a shell of the computing device 100. In some embodiments, the antenna window 208 may not be a physical opening but composed of material configured to enable wireless signals to pass through, including radio signals, to the radio communication system 110 of FIG. 1. The antenna window 208 may also be configured to enable signals related to the proximity of a user to be received at the proximity sensor element 206.

The proximity sensor element 206 may be configured to detect the presence of nearby objects, such as a user of the computing device 100. The proximity sensor element 206 may be a proximity sensor such as a capacitive photoelectric sensor, an inductive proximity sensor or another proximity sensor. In one embodiment, the proximity sensor element 206 is a capacitive proximity sensor configured to detect a frequency charge and discharge associated with changes in a user's proximity. As shown in FIG. 2, the proximity sensor element 206 is integrated in the antenna module 104, and is disposed in a free space area of the antenna module 104 between the active element 202 and the ground plane 204.

Figure 3:
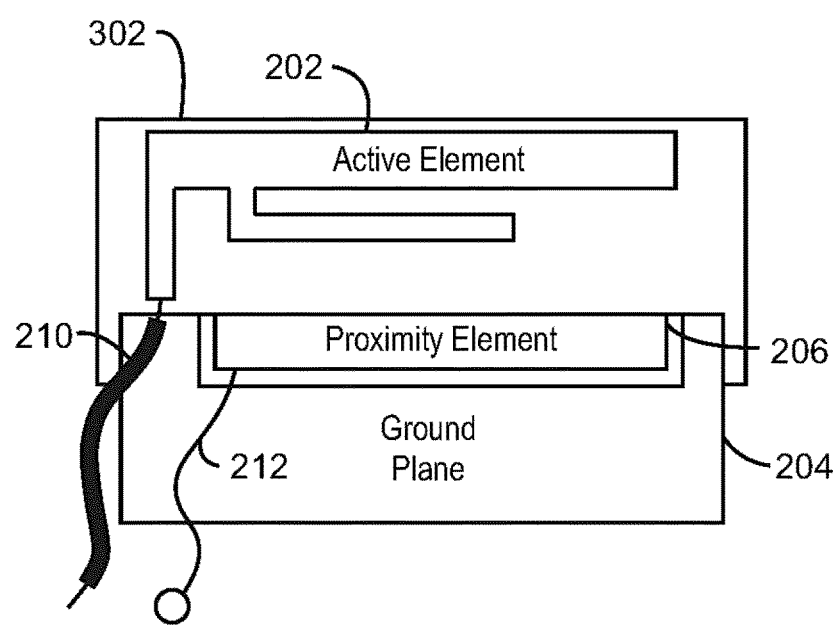
FIG. 3 is a top view of the antenna module with a proximity sensor element isolated within the ground plane according to an implementation.

FIG. 3 is a top view of the antenna module 104 including the proximity sensor element 206 isolated within the ground plane 204. In this embodiment, the proximity sensor element 206 may be disposed within a recess of the ground plane 204. The proximity sensor element 206 may be capacitively coupled via a dielectric material to the ground plane 204, and the proximity sensor 206 is separate from the active element 202. As shown in FIG. 3, the proximity sensor element 206 is more isolated from the active element 202, as compared to the embodiment illustrated in FIG. 2, and thus, the active element 202 may have more volume to optimize radio frequency transmissions. As illustrated in FIG. 3, the antenna 104 may include an antenna window 302. The antenna window 302 may be relatively larger than the antenna window 208 illustrated in FIG. 2.

Figure 4:
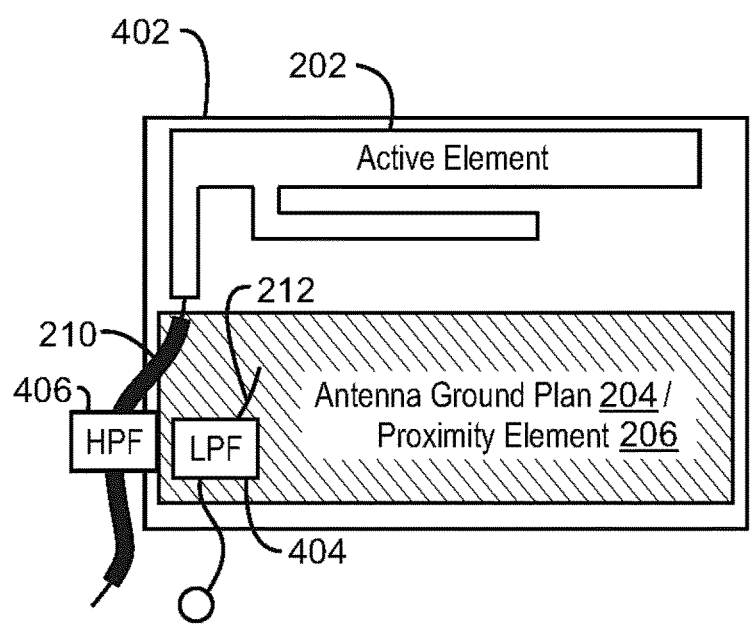
FIG. 4 is a top view of the antenna module with the proximity sensor element in the ground plane according to an implementation.

FIG. 4 is a top view of the antenna module 104 with the proximity sensor element 206 in the ground plane. In this embodiment, the proximity sensor element 206 may be integrated with the ground plane 204. In some embodiments, the proximity sensor element 206 is disposed within footprint of the active element 202, and the proximity element 206 is separate from the active element 202. In this embodiment, the antenna module 104 may also include a low pass filter 404 and a high pass filter 406. The low pass filter 404 may receive signals from both the ground plane 204 and the proximity sensor element 206. As illustrated in FIG. 4, the low pass filter 404 is an inline element of the sensor pad interconnect 212. The low pass filter 404 may be configured to enable proximity signals to be communicated to the computing device 100 by substantially filtering out high frequency signals associated with the ground plane 404. Likewise, the high pass filter 406 is an inline element of the conductive interconnect 210. The high pass filter 406 may be configured to receive signals from both the active element 202 and the proximity sensor element 206. The high pass filter 504 may be configured to enable radio signals to be communicated to the computing device 100 by substantially filtering out low frequency signals associated with the proximity sensor element 206. By integrating the proximity sensor element 206 with the ground plane 206, the active element 202 may reference the entire ground plane 204 for increased radio frequency performance, in comparison to the embodiment illustrated in FIG. 3. In this embodiment, the antenna window 402 may be relatively large when compared to the antenna window 208 or the antenna window 302 as in the embodiments illustrated in either FIG. 2 or FIG. 3.

Figure 5:
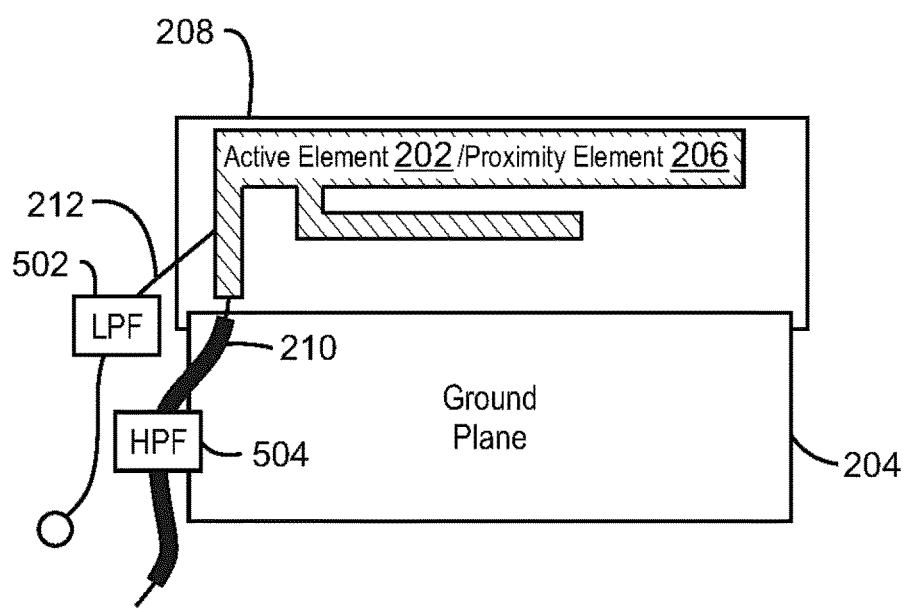
FIG. 5 is a top view of the antenna module with the proximity sensor element in the active element of the antenna module according to an implementation.

FIG. 5 is a top view of the antenna module 104 with the proximity sensor element 206 in the active element 202 of the antenna module 104. In this embodiment, the proximity sensor element 206 may be integrated with the active element 202, yet the proximity element 206 is separate from the active element 202. In this embodiment, the antenna module 104 may also include a low pass filter 502 and a high pass filter 504. The low pass filter 504 may receive signals from both the active element 202 and the proximity sensor element 206. As illustrated in FIG. 5, the low pass filter 502 is an inline element of the sensor pad interconnect 212. The low pass filter 502 may be configured to enable proximity signals to be communicated to the computing device 100 by substantially filtering out high frequency signals associated with the active element 202. Likewise, the high pass filter 504 is an inline element of the conductive interconnect 210. The high pass filter 504 may be configured to receive signals from both the active element 202 and the proximity sensor element 206. The high pass filter 504 may be configured to enable radio signals to be communicated to the computing device 100 by substantially filtering out low frequency signals associated with the proximity sensor element 206. In some embodiments, a footprint of the proximity sensor element 206 is disposed within a footprint of the ground plane 204. By integrating the proximity sensor element 206 with the active element 202, the antenna window 208 may not need to be smaller than the embodiment illustrated in FIG. 2, and may be relatively smaller an antenna window 302 and 402 in the embodiments illustrated in either FIG. 3 or FIG. 4, respectively.

Figure 6:
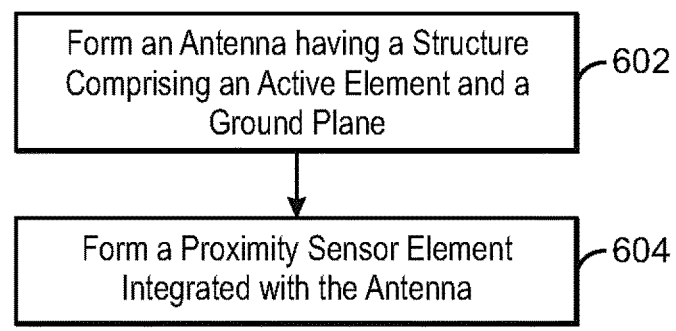
FIG. 6 is a block diagram illustrating a method of forming an antenna module with an integrated proximity sensor element according to an implementation.

FIG. 6 is a block diagram illustrating a method of forming an antenna module with an integrated proximity sensor element. The method 600 may include forming an antenna module having a structure comprising an active element and a ground plane. The method 600 may include forming a proximity sensor element integrated within the antenna module.

In some embodiments, the proximity sensor element is formed between the active element and the ground plane. In other embodiments, the method 600 may include forming a recess within the ground plane, wherein the proximity sensor element is formed within the recess of the ground plane. In other embodiments, the proximity sensor element is formed to be integrated with the ground plane. In other embodiments, the proximity sensor element is formed to be integrated with the active element. In yet other embodiments, the proximity sensor element is formed to be capacitively coupled to the ground plane.

Forming the active element, the ground plane, and the proximity sensor element may be carried out by any process enabling the elements and sensor to be conductive including, printed circuit board etching, forming of conductive plates, depositing conductive metal on plastic material, and the like. By forming the proximity sensor element as an integrated component of the antenna module, a relatively smaller, space-saving, design is contemplated. The relatively smaller design may enable the active element of the antenna module to be disabled when a user is detected to be nearby via the proximity sensor element.

The terms, descriptions and figures used herein are set from by way of illustration only and are not meant as limitations. Those skilled in the art will recognize that many variations are possible within the scope of the invention, which is intended to be defined by the following claims—and there equivalents—in which all terms are meant in their broadest reasonable sense unless otherwise indicated.

What is claimed is:

1. An electronic device, comprising:
   an antenna module comprising an active element and a ground plane;
   an antenna window to expose the active element and at least a portion of the ground plane; and
   a proximity sensor element integrated within the antenna module and conductively isolated from the active element and the ground plane by a dielectric material, wherein the proximity sensor is disposed in a recess of the ground plane, and wherein the proximity sensor element is to detect proximity of a user.

2. The electronic device of claim 1, wherein the proximity sensor element is integrated within the antenna module by being disposed between the active element and the ground plane.

3. The electronic device of claim 1, wherein the proximity sensor element is coupled to a low pass filter and the active element is coupled to a high pass filter.

4. An antenna module, comprising:
   an active element to receive and provide wireless signals;
   a ground plane to provide a reference to the wireless signals; and
   a proximity sensor element to detect proximity of a user of the antenna module, wherein the proximity sensor element is conductively isolated from the active element and the ground plane by a dielectric material and is integrated within the antenna module by being disposed in a recess of the ground plane.

5. The antenna module of claim 4, wherein the proximity sensor element is integrated within the antenna module by being disposed between the active element and the ground plane.

6. The antenna module of claim 4, wherein the proximity sensor element is coupled to a low pass filter and the active element is coupled to a high pass filter.

7. A method, comprising
   forming an antenna module comprising an active element and a ground plane; and
   forming a proximity sensor element integrated within the antenna module and conductively isolated from the active element and the ground plane by a dielectric material, wherein the proximity sensor is disposed in a recess of the ground plane.

8. The method of claim 7, wherein the proximity sensor element is formed between the active element and the ground plane.

9. The method of claim 7, wherein the proximity sensor is formed to be coupled to a low pass filter and the active element is formed to be coupled to a high pass filter.

10. An electronic device, comprising:
    an antenna module comprising an active element and a ground plane;
    an antenna window to expose the active element and at least a portion of the ground plane; and
    a proximity sensor element integrated within the antenna module and conductively isolated from the active element and the ground plane by a dielectric material, wherein the proximity sensor is disposed in a free space area of the antenna module between the active element and the ground plane, and wherein the proximity sensor element is to detect proximity of a user.

11. The electronic device of claim 10, wherein the proximity sensor element is coupled to a low pass filter and the active element is coupled to a high pass filter.

* * * * *